United States Patent [19]

Murayama et al.

[11] Patent Number: 4,965,837

[45] Date of Patent: Oct. 23, 1990

[54] ENVIRONMENTALLY RESISTANT LOUDSPEAKER

[75] Inventors: Fumio Murayama; Yoshiaki Homma, both of Yamagata, Japan

[73] Assignee: Pioneer Electronic Corporation, Tokyo, Japan

[21] Appl. No.: 429,916

[22] Filed: Oct. 31, 1989

[30] Foreign Application Priority Data

Dec. 28, 1988 [JP] Japan ................................ 63-328812
Dec. 28, 1988 [JP] Japan ................................ 63-328813

[51] Int. Cl.[5] ................................................ H05K 5/00

[52] U.S. Cl. .................................... 381/186; 181/144; 181/152; 181/155; 181/159

[58] Field of Search ............... 181/144, 152, 155, 159, 181/191, 194; 381/182, 186

[56] References Cited

U.S. PATENT DOCUMENTS

| | | | |
|---|---|---|---|
| 1,790,120 | 1/1931 | Thomas | 381/186 |
| 2,259,907 | 10/1941 | Olney | 381/186 |
| 2,517,138 | 8/1950 | Seabert | 381/186 |
| 3,816,672 | 6/1974 | Gefvert et al. | 181/144 |
| 4,182,429 | 1/1980 | Senzaki | 381/186 |
| 4,303,142 | 12/1981 | Urban | 181/144 |
| 4,365,114 | 12/1982 | Soma | 181/144 |
| 4,492,826 | 1/1985 | Chiu | 181/144 |
| 4,552,242 | 11/1985 | Kashiwabara | 181/144 |
| 4,553,630 | 11/1985 | Ando | 181/144 |
| 4,672,675 | 6/1987 | Powell et al. | 381/186 |

*Primary Examiner*—Forester W. Isen
*Attorney, Agent, or Firm*—Sughrue, Mion, Zinn, Macpeak and Seas

[57] ABSTRACT

A grille is attached to a woofer, and a tweeter is further mounted on the grille to mutually face the woofer and be at least partially disposed in a cavity defined by the woofer and grille to define a compact loudspeaker structure. The grille and a back of the tweeter face an environment to which sound is to be directed, and both contain structures and are arranged to allow sound from the tweeter and woofer to communicate with the environment, while resisting water from contaminating the woofer and tweeter. Further, the rim of the grille and a frame define a component storage space in which elements which constitute a dividing network or other discrete electronic components of the loudspeaker are housed.

6 Claims, 3 Drawing Sheets

ENVIRONMENTALLY RESISTANT LOUDSPEAKER

BACKGROUND OF THE INVENTION

The present invention relates to an improved loudspeaker which comprises a tweeter and a woofer in a compact and environmentally resistant arrangement suitable for mounting in harsh environments such as on a ship or the like where water may splash on the loudspeaker.

A conventional loudspeaker comprising a tweeter and a woofer is usually mounted in such a manner that the tweeter and the woofer face in the same direction Another conventional loudspeaker comprises a tweeter and a woofer, whose axes are crossed with each other in order to mount the loudspeaker in the baggage space between the back seat and rear window of a motor vehicle. However, the vibrating sheets of the tweeter and the woofer are oriented in such a manner that the vibrating sheets are visible, and are thus environmentally exposed from the front of the loudspeaker.

If the tweeter of each of the conventional loudspeakers is shaped as a horn speaker, the horn projects by a necessary length from the front of the speaker. Since the tweeter as well as the woofer of each of the loudspeakers faces forward, water splashes or the like are likely to sprinkle on the vibrating sheet, voice coil and so forth of the tweeter due to waves against a ship, washing or the like. If the water is sea water, it is very likely to cause the vibrating sheet, voice coil and so forth of the tweeter to corrode and thus lower the reliability thereof. If the tweeter is a horn speaker, the length of the tweeter is increased to augment that of the speaker to make it disadvantageous as to the mounting thereof. In addition, a conventional loudspeaker system has a dividing network or circuit such that the tweeter and the woofer share a whole frequency range. The dividing network comprises a choke coil and a capacitor. The aforementioned water splashes or the like are also likely to sprinkle on the dividing network causing it to rust and to disconnect the lead wire of the capacitor at the body thereof, and destroying the electrically insulating film of the choke coil. Even if the dividing network is housed in a container to prevent the water splashes or the like from sprinkling on the dividing network, a typical location in which the loudspeaker is mounted is likely to make it impossible to provide a space to place the container.

SUMMARY OF THE INVENTION

The present invention was made in order to solve the above-mentioned problems of the conventional loudspeakers.

Accordingly, it is an object of the present invention to provide a loudspeaker in which the axial length of the loudspeaker is not increased by that of the tweeter of the loudspeaker though the tweeter is shaped as a horn speaker; and water splashes or the like are unlikely to reach directly to the vibrating sheet and voice coil of the tweeter. A grille is attached to the front of the woofer of the loudspeaker. The tweeter is attached to the grille in such a manner that the tweeter and the woofer face in mutually opposite directions. A bowl-shaped space extends from the front of the tweeter to the grille. Since the tweeter faces in the opposite direction to the woofer, the water splashes or the like which fly to the front of the grille are prevented from directly reaching the vibrating sheet and voice coil of the tweeter. Therefore, the loudspeaker can be used as a durable marine loudspeaker.

It is another object of the present invention to provide a loudspeaker in which elements or discrete electronic components constituting the dividing network or the like of the loudspeaker are disposed inside the loudspeaker so that the water splashes or the like are prevented from reaching the elements. The body and rims of the frame of the loudspeaker and a grille constituting the front of the loudspeaker define a space in which the elements are housed. For that reason, the elements do not require labor and a space to place the elements separately from the body of the loudspeaker. Besides, the elements are covered with the frame and the grille so that the water splashes or the like are prevented from reaching the elements to cause them to undergo troubles such as wire disconnection and dielectric breakdown due to corrosion.

DETAILED DESCRIPTION OF THE PREFERRED EMBODIMENT

An embodiment of the present invention is hereafter described in detail with reference to the drawings attached hereto.

Figure 1:
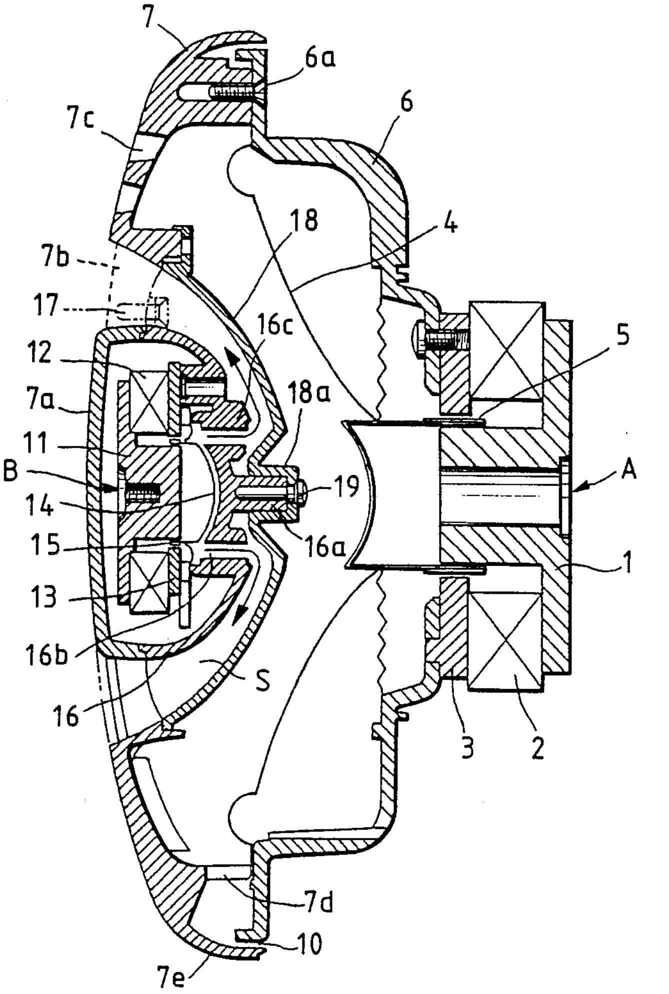
FIG. 1 is a longitudinally sectional view of a loudspeaker which is an embodiment of the present invention.

FIG. 1 shows a loudspeaker in a preferred embodiment of the invention. The loudspeaker has a yoke 1, a magnet 2 and a plate or frame 3 which form the magnetic circuit of the woofer A of the loudspeaker. A voice coil 5 is attached to a vibrating sheet 4 or diaphragm and is inserted in a magnetic gap between the yoke 1 and the plate 3. The peripheral edge of the vibrating sheet 4 is stuck with an adhesive to a frame 6 attached to the frame 3. When a signal current flows through the voice coil 5, the vibrating sheet 4 vibrates due to a driving force caused between the voice coil 5 and the magnet 2. A grille 7 is attached to the frame 6 by screws *6a*.

Figure 2:
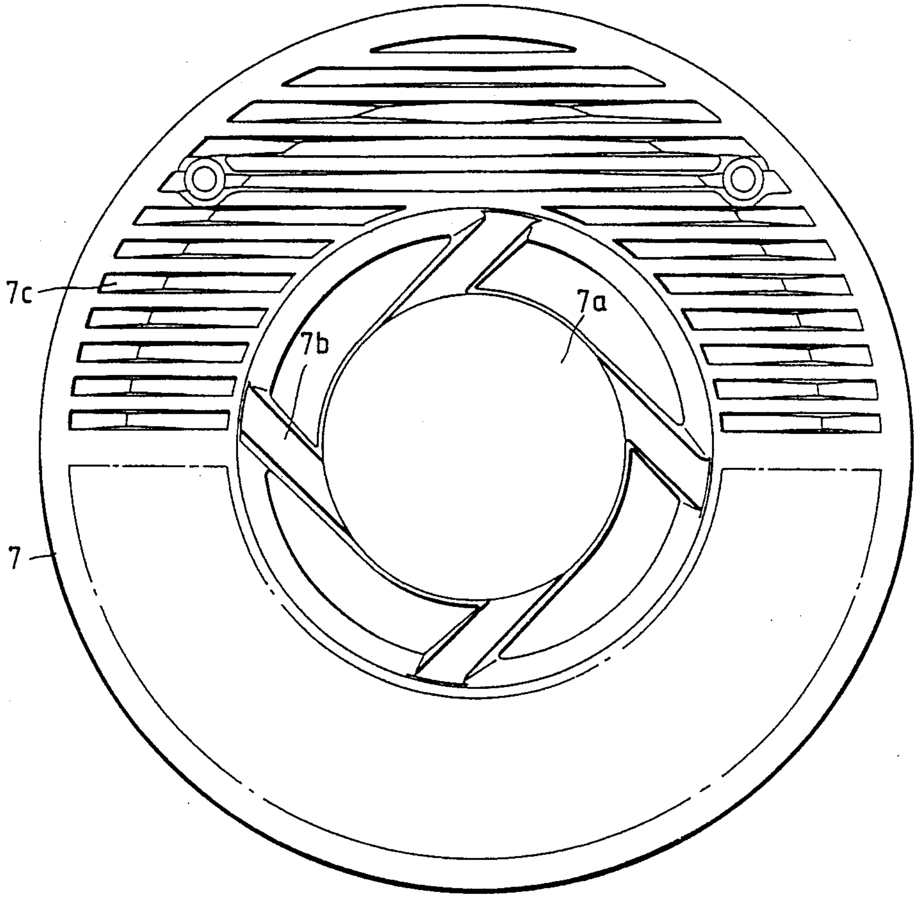
FIG. 2 is a front view of the loudspeaker.

As shown in FIG. 2, the grille 7 has a central mounting portion **7*a* to which the tweeter B of the loudspeaker is attached. The central mounting portion 7*a* is supported by a plurality of arms 7*b* and has sound passage openings 7*c*, through which the sound of the woofer A is released. The peripheral portion of the grille 7 has an inner rim 7*d* and an outer rim 7*e***.

Figure 4:
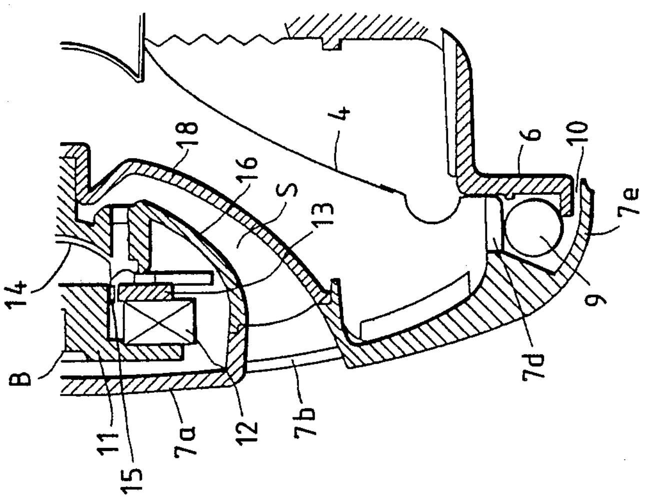
FIG. 4 is sectional view of the loudspeaker along a line I—I shown in FIG. 3.
Figure 3:
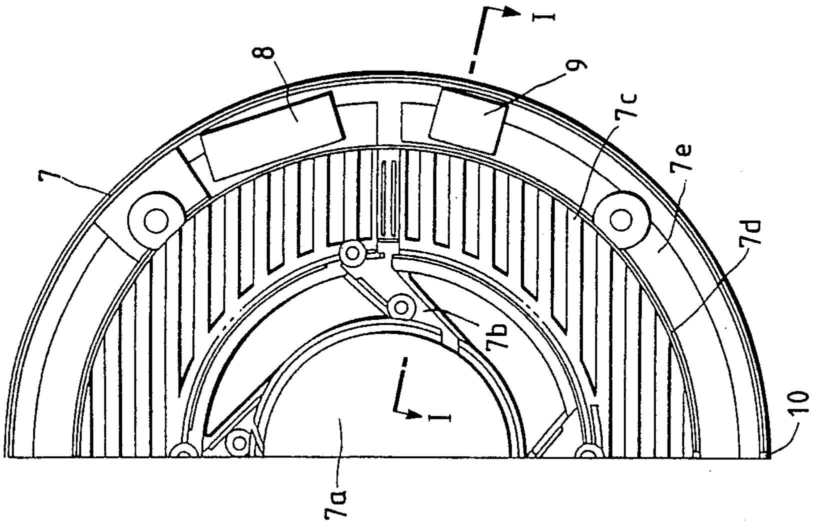
FIG. 3 is a partial rear view of the grille of the loudspeaker.

As shown in FIGS. 3 and 4, a choke coil 8 and a capacitor 9, which constitute a dividing network (for causing the woofer A and the tweeter B to share the whole frequency range) are provided between the inner and the outer rims **7*d* and 7*e*. A water drain opening 10 for draining water entered into a space defined by the frame 6, the inner rim 7*d* and the outer rim 7*e* is provided between the frame 6 and the outer rim 7*e*, as shown in FIG. 1. A water drain, such as a hole in the outer rim 7*e*, may be provided instead of the water drain opening 10**. In a preferred embodiment, the water drain means or opening is provided at the lowest point in the outer rim 7*e* or frame 6 with respect to gravity, to provide the most effective draining of the aforementioned space (component housing space) between the frame 6 and the outer rim 7*e*. Further, in a preferred embodiment, the choke coil 8 and the capacitor 9 are provided at locations (within the aforementioned component space) spaced from the water drain means or opening (preferably at an upper location of the component housing space) to distance and protect the choke coil 8 and capacitor 9 from any water which might enter the space through the water drain means or opening.

The magnetic circuit of the tweeter B is composed of a yoke 11, a magnet 12 and a plate 13. A voice coil 15 for a vibrating sheet or diaphragm 14 is inserted in the magnetic gap of the magnetic circuit. When a signal current flows through the voice coil 15, the vibrating sheet 14 vibrates. The plate 13 is attached to a mounting plate 16 which is an inner bowl-shaped plate attached to the central mounting portion 7*a* of the grille 7 by screws 17. The central portion of the mounting plate 16 has a boss 16*a* inserted into the recess 18*a* of a support plate 18 and attached thereto by a screw 19. The support plate 18 is an outer bowl-shaped plate. A bowl-shaped space S having a function as a horn is defined between the mounting plate 16 and the support plate 18. A sound released through a front sound passage hole 16*b* provided in the mounting plate 16 in front of the vibrating sheet 14 is transmitted to the front of the grille 7 through the bowl-shaped space S. The mounting plate 17 has a projection 16*c* around the sound passage hole 16*b*. An opening is formed between the projection 16*c* and the support plate 18.

Thus, the sound of the woofer A of the loudspeaker is transmitted to the front of the grille 7 through the sound passage openings 7*c*, and the sound of the tweeter B of the loudspeaker is transmitted to the front of the grille through the bowl-shaped space S and then between the arms 7*b* of the grille.

Since the tweeter B faces in the opposite direction to the woofer A, water splashes or the like which fly to the front of the grille 7 are prevented from directly reaching the vibrating sheet 14 and voice coil 15 of the tweeter. Even if some of the water splashes or the like enter into the bowl-shaped space S, the projection 16*c* around the sound passage hole 16*b* in front of the vibrating sheet 14 serves to resist entry so that the water splashes or the like which have entered into the space are kept from entering into the hole, but instead are drained to go down between the mounting plate 16 and the support plate 18 without wetting the vibrating sheet 24 and the voice coil 15.

Since the choke coil 8 and the capacitor 9 which constitute the dividing network are housed in the space defined by the frame 6 and the inner and outer rims 7*d* and 7*e* of the grille 7, it is not necessary separately to provide a space to house the choke coil and the capacitor, and water splashes or the like are prevented from reaching the choke coil and the capacitor. Even if water or the like enters into the space defined by the frame 6 and the inner and outer rims 7*d* and 7*e* of the grille 7, the water or the like is drained through the water drain opening 10 so that the choke coil and the capacitor are protected from damage such as wire disconnection and dielectric breakdown based on corrosion.

Since the bowl-shaped space S through which the sound of the tweeter B is transmitted to the front of the grille 7 is defined between the tweeter and the woofer A, and the tweeter is at least partially disposed in a cavity defined by the frame and woofer, the axial length of the loudspeaker is prevented from being increased by the axial length of the space as in a conventional device and the degree of freedom allowed in placing the loudspeaker is heightened.

What is claimed is:

1. A loudspeaker comprising:
woofer means;
grille means attached to the front of said woofer means;
tweeter means attached to said grille means in such a manner that said tweeter means and said woofer means face in mutually opposite directions; and
wherein a communication space is defined between said tweeter means and said grille means to direct sound from said tweeter means in the same direction as sound from said woofer means.

2. A loudspeaker as claimed in claim 1, wherein said woofer means comprises a frame which mates with said grille means and wherein the mating of said frame and said grille means defines a component housing space in which elements which constitute a dividing network and other discrete electronic components of said loudspeaker are housed.

3. A loudspeaker as claimed in claim 2, wherein said tweeter means is at least partially disposed within a cavity defined by said woofer means and said grille means to minimize the length of said loudspeaker.

4. A loudspeaker as claimed in claim 3, wherein at least one of said frame and said grille means includes water drain means for allowing draining of water contaminating at least one of said component housing space and said cavity.

5. A loudspeaker as claimed in claim 3,
wherein said grille means includes means for allowing sound from said woofer means to communicate with an environment outside of said cavity, while resisting water from contaminating said cavity; and
wherein said tweeter means includes a diaphragm, voice coil and magnet means, and further includes means for allowing sound from said tweeter means to communicate with said communication space, while resisting water from contaminating said diaphragm, voice coil and magnet means.

6. A loudspeaker as claimed in claim 5, wherein said grille means includes a bowl-shaped portion in the vicinity of, and into which said tweeter means faces, such that said communication space is bowl-shaped to act as a horn chamber for said tweeter means.

* * * * *